(12) United States Patent
Lagö et al.

(10) Patent No.: US 6,243,671 B1
(45) Date of Patent: Jun. 5, 2001

(54) DEVICE AND METHOD FOR ANALYSIS AND FILTRATION OF SOUND

(76) Inventors: Thomas Lagö, Snöbollsvägen 29, 564 34 Bankeryd (SE); Sven Olsson, Ankaregränden 6, 226 51 Lund (SE)

(*) Notice: Subject to any disclaimer, the term of this patent is extended or adjusted under 35 U.S.C. 154(b) by 0 days.

(21) Appl. No.: 09/224,942

(22) Filed: Jan. 4, 1999

Related U.S. Application Data

(63) Continuation of application No. PCT/SE97/01175, filed on Jun. 30, 1997.

(30) Foreign Application Priority Data

Jul. 3, 1996 (SE) .................................................. 9602627

(51) Int. Cl.[7] ............................. G10L 15/16; G10L 21/02
(52) U.S. Cl. ....................... 704/200.1; 704/232; 381/94.3
(58) Field of Search .................................. 704/203, 205, 704/226, 227, 228, 233, 232, 200.1; 381/94.1, 94.2, 94.3

(56) References Cited

U.S. PATENT DOCUMENTS

| | | | |
|---|---|---|---|
| 4,959,865 | * 9/1990 | Stettiner et al. | 704/233 |
| 5,285,522 | 2/1994 | Mueller . | |
| 5,377,302 | 12/1994 | Tsiang . | |
| 5,450,522 | * 9/1995 | Hermansky et al. | 704/211 |
| 5,732,388 | * 3/1998 | Hoege et al. | 704/226 |
| 5,842,162 | * 11/1998 | Fineberg | 704/233 |

FOREIGN PATENT DOCUMENTS

4207728A1  9/1993  (DE) .

OTHER PUBLICATIONS

Zhang et al., "Resonator based logarithmic filters," IEE Proceedings I, Communications, Speech and Vision, vol. 139, Issue 1, Feb. 1992, pp. 36 to 44.*

Waters et al., "Least squares IIR filter design on a logarithmic frequency scale," IEEE International Symposium on Circuits and Systems, vol. 1 May 1993, pp. 635 to 638.*

Strope et al., "A model of dynamic auditory perception and its application to robust speech recognition," Conference Proceedings, 1996 IEEE International Conference on Acoustics, Speech, and Signal Processing, vol. 1, May 1996, pp. 37 to 40.*

Strope et al., "A model of dynamic auditory perception and its application to robust word recognition," IEEE Transactions on Speech and Audio Processing, Vol. 5, Sept. 1997, pp. 451 to 464.*

* cited by examiner

*Primary Examiner*—William R. Korzuch
*Assistant Examiner*—Martin Lerner
(74) *Attorney, Agent, or Firm*—Smith, Gambrell & Russell, LLP

(57) ABSTRACT

A device for analysis and filtration of sound which comprises at least one frequency-linear filter, at least one frequency-logarithmic filter and a weighting means for the combining and non-linear weighting of the output signals from the frequency-linear filter and the frequency-logarithmic filter. The sound is fed parallel as an input signal to the two sets of filters. In turn, the output signals from the filters are fed to the weighting means where they are combined and weighted non-linearly on the basis of magnitudes relevant to the sound. A decision with respect to the identity of the sound is made in a decision means. The invention also relates to a method for analyzing and filtering sound with the aid of the above-mentioned device.

13 Claims, 2 Drawing Sheets

FIG 3

A
PARALLEL FILTERING IN A FREQUENCY-LINEAR FILTER AND A FREQUENCY-LOGARITHMIC FILTER

B
COMBINATION AND NON-LINEAR WEIGHTING OF OUTPUT SIGNALS FROM THE TWO FILTERS

C
MAKING A DECISION WITH RESPECT TO THE IDENTITY OF THE SIGNAL

DEVICE AND METHOD FOR ANALYSIS AND FILTRATION OF SOUND

This application is a continuation of International Application No. PCT/SE97/01175, filed on Jun. 30, 1997.

FIELD OF THE INVENTION

The present invention relates to a device for analysis and filtration of sound. The invention also relates to a method for analysing and filtering sound.

BACKGROUND OF THE INVENTION

In many fields, it is important to be able to analyse sound in order to classify and identify different types of sound. For example, in the car and aviation industry it is often necessary to classify sounds from machines and engines in order to diagnose possible problems, such as cracks or worn bearings in the machine or engine. Speech recognition is another field where reliable analysis of sound is required. Today, a few different methods are employed for speech identification. A device for speech recognition is described in U.S. Pat. No. 5,285,522. Here, neural nets are used to recognise different voice patterns. The input signals to the neural nets come from a set of bandpass filters which separate the input acoustic patterns into frequency ranges. Another system for speech recognition is disclosed in U.S. Pat. No. 5,377,302, In this case, too, a neural net is employed, whose input signal consists of a signal filtered in multiple stages. The object of that system is to improve recognition of phonemes from speech. Both systems have difficulty analysing sound signals since they are not capable of distinguishing the magnitudes of the signals which are relevant to sound analysis. The reason for this is mainly that the processing of the signal prior to the neural filter cuts out important information and that the degrees of freedom are too limited. In addition, there are systems which work with neural nets only. However, in such systems, the neural nets cannot perform their task because the degrees of freedom are too many. It has become apparent that a certain amount of processing of the signal is required prior to it being fed to a neural net. Consequently, the neural nets do not have the intended effect in the known systems since they receive either too much or too little information about the signals. The same drawbacks as the ones associated with speech recognition would arise if one were to attempt to use the systems mentioned above for classification of machine or engine sounds.

The method most commonly employed today for classifying such sounds consists of simply listening to the machines with a stethoscope. Often, an experienced and trained ear has proven to be the most reliable tool for classifying and identifying various malfunction sounds and dissonances in, for example, an engine. Obviously, this method of classification has a number of drawbacks. Relying on a person's hearing is, of course, risky in itself since, for one thing, our hearing changes with time. In addition, it takes a long time for a person to bring her ability to recognise sound up to a level where misinterpretations are avoided to the greatest extent possible. Consequently, it is obvious that there is a need for a device which obviates the above-mentioned drawbacks of the prior art and which can analyse and filter sound in order to identify and classify accurately and reliably different sound types and sound patterns.

OBJECTS OF THE INVENTION

An object of the present invention is to provide a device for analysis and filtration of sound which unlike prior art devices permits reliable classification and recognition of different sound types and sound patterns.

Another object of the invention is to provide a reliable method for analysing and filtering sound.

SUMMARY OF THE INVENTION

According to the invention, a device and a method according to claims 1 and 7 have been provided in order to achieve the above-mentioned objects. The advantage of the invention is that the two different types of filtration, prior to the non-linear weighting, extract the information, such as magnitudes or eigenvalues, contained in an input signal which is relevant to the analysis and identification of sound and which provides the best conditions for efficient non-linear weighting.

One factor which contributed to the solution according to the invention is the insight that a system for the analysis of sound should emulate the manner in which our hearing analyses sound, something which will be set forth below.

According to a preferred embodiment of the device, the weighting means consists of a neural net. The filter combination is particularly suited for use with a neural net, which is thereby provided with a signal with a suitable number of degrees of freedom.

As mentioned above, to date there is no prior art which even remotely approaches the ability of the human ear when it comes to analysing the sound from, for example, an engine. Moreover, there is no known system which can compete with human hearing when it comes to identifying a particular voice. However, it is a requirement of sound identification that the person listening has "learned" the specific sound, i.e. the neural system and the brain must be able to relate the sound to previous experience in order recognise it. Consequently, the invention is based on the insight that in order to best analyse sound one must emulate an optimal, fully-trained human ear with its associated neural system. In order to analyse sound in a reliable manner, one must above all come to the realisation that the neural system which is responsible for evaluating the signals which are fed to the ear cannot be considered linear. On the contrary, our hearing reacts in a non-linear manner to changes of frequency, for example. Consequently, the present invention is also based on the insight that human hearing should be considered a non-linear system.

BRIEF DESCRIPTION OF THE DRAWINGS

FIG. 3 shows a flow chart of the method for analysing and filtering sound according to a preferred embodiment of the present invention.

DESCRIPTION OF PREFERRED EMBODIMENTS

The invention will be described in more detail below with reference to the accompanying drawings.

Figure 1:
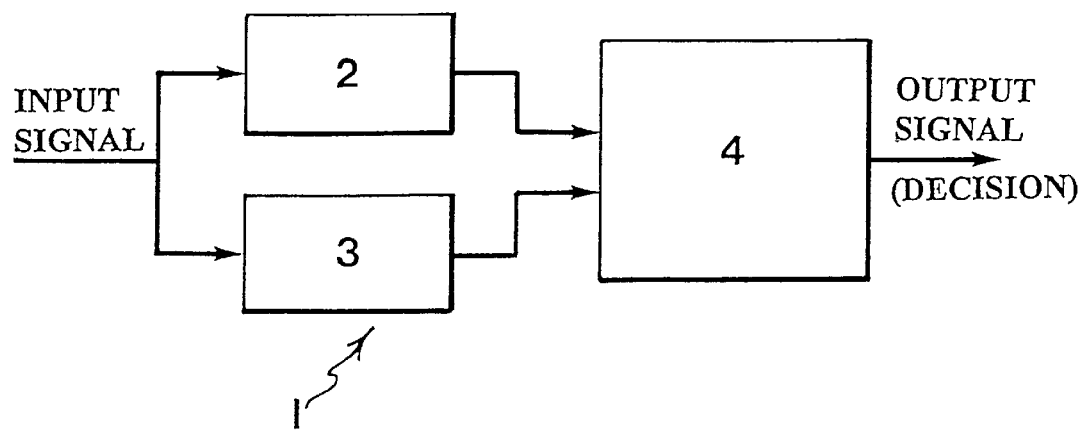
FIG. 1 shows a block diagram of the device for analysis and filtration of sound according to a preferred embodiment of the present invention.

FIG. 1 shows a block diagram of the device 1 for analysis and filtration of sound according to a preferred embodiment of the present invention. The device 1 comprises a frequency-linear filter 2, a frequency-logarithmic filter 3 and a weighting means 4. In this embodiment, the weighting means 4 consists of a neural filter. The linear filter 2 has 800 lines and the logarithmic filter 3 has 32 one-third octave bands. This provides a total of 832 time signals which by means of the neural net 4 are combined and weighted non-linearly.

The task of the filter banks is to filter an input signal in such a way that only the parameters which are of interest to the analysis of sound are let through. Such sorting out of relevant information is possible because of the characteristics of the parallel filter banks. As is well known, frequency-linear filters have fixed filter bandwidths and consequently fixed magnitudes, such as, for example, a constant integration interval and a constant variance, while these magnitudes vary in frequency-logarithmic filters. This parallel combination of linear and logarithmic filters is necessary in the filtration and analysis of sound since sound is composed of non-stationary signals. It is, of course, very important to take the non-stationary characteristics of sound into consideration, but, despite this, the prior art has not fully taken this fact as its starting-point, but instead, in several cases, has approximated sound with a stationary signal.

Several possible parameters of the signals may be taken into consideration in the subsequent weighting process. Some of these are level strengths, energy content, and duration in time. In addition, comparisons between the output signals from the logarithmic filter and linear filter are taken into consideration. For example, signals which contain harmonics look completely different in one-third octave band than in narrow-band. This means that it is possible to register harmonies and disharmonies by comparing the presence of signal components in the bands of the linear and the logarithmic filters respectively. Carrying out this harmony analysis means emulating the function of human hearing. Moreover, to continue the analogy with human hearing, the present invention takes into consideration the fact that an individual must have previously heard a sound in order to be able to identify it. Consequently, the device according to the present invention employs learning sequences with different sound patterns, such as certain person's voice, the sound of a worn bearing in an engine, etc., in order to teach the system to recognise these patterns. Information regarding classification, such as "worn bearing" or "good bearing", is added to each new sound, so that the system will be able to identify the sound the next time it hears it. Thus, the learning of a new sound means that non-linear weighting of the input signals from the filter banks is performed, and then this non-linear weighting is saved and classified for subsequent identification of similar sounds.

Figure 2:
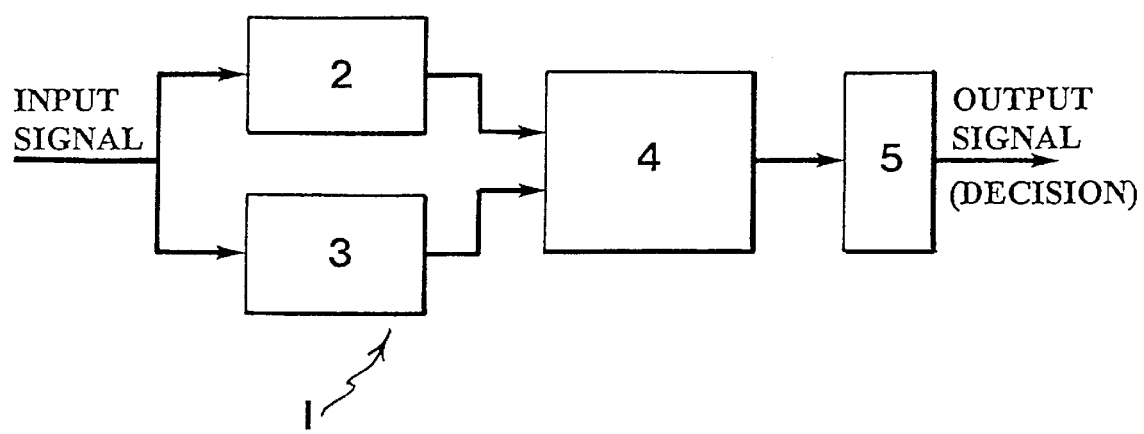
FIG. 2 shows a block diagram of the device for analysis and filtration of sound according to another preferred embodiment of the present invention.

The actual identification decision occurs in a decision means 5. According to this embodiment, the decision means 5 is located in the weighting means 4. FIG. 2 shows another embodiment in which the decision means 5 is arranged outside the neural net 4. The decision means 5 makes decisions on the basis of the learned sequences and their classification. After filtration and non-linear weighting, an input signal to the device 1 is compared to the previously learned sounds and the most likely answer is chosen in the decision means b as the identity of the signal.

FIG. 3 shows a flow chart of the method for analysing and filtering sound according to a preferred embodiment of the present invention. The input signal to the device 1 is filtered parallel in step A after being parallel fed to the frequency-linear filter 2 and the frequency-logarithmic filter 3. Subsequently, in step B, the resulting output signals from the two filters 2, 3 are combined and weighted non-linearly in the neural net 4 according to the above description. Finally, in step C, the signal from the neural net 4 is fed to the decision means 5 where a decision is made with respect to the identity of the signal.

Accordingly, the present invention provides reliable analysis of sound by emulating human hearing. The parallel filter banks break down a sound signal into its components, and the weighting means weights and combines these components non-linearly on the basis of magnitudes which are relevant to human hearing, such as levels, harmonies, etc. The weighting is then saved and classified in order to be used when a sound is to be identified, the saved weighting being compared to the weighting of the sound which is to be identified.

ALTERNATIVE EMBODIMENTS

Modifications of the device and the method according to the invention are possible within the scope of the invention. The following are some examples of such modifications.

The device and the method according to the invention may also be employed to generate a particular signal. In this case, the system is trained in a learning process, as discussed above, and then uses the saved weightings to generate a copy of the signal learned.

According to a preferred embodiment, the number of lines of the frequency-linear filter is stated as 800, but other numbers of lines are possible depending on the nature of the application. This also applies to the bands of the frequency-logarithmic filter which by no means is limited to 32 one-third octave bands, rather, more or fewer bands of different kinds may be suitable depending on the application.

Similarly, the parameters which are used in the weighting may vary on the basis of the desired characteristics of the device according to the invention.

The non-linear weighting can be achieved by analogue or digital systems instead of a neural net. These systems can have more or less fixed filter structures depending on the application in question.

It might be possible to achieve the frequency-logarithmic filter with the aid of wavelet transforms.

What is claimed is:

1. A device for analysis and filtration of sound, which device receives an input signal characterised in that it comprises at least one frequency-linear filter, at least one frequency-logarithmic filter for parallel filtration of the input signal, and a weighting means for combination and non-linear weighting of the output signals from the frequency-linear filter and the frequency-logarithmic filter.

2. A device according to claim 1, characterised in that the weighting means consists of a neural net.

3. A device according to claim 2, characterized in that the frequency-linear filter consists of 800 lines.

4. A device according to claim 2, characterised in that the frequency-logarithmic filter consists of 32 one-third octave bands.

5. A device according to claim 2, characterized in that it comprises a decision means for making a decision with respect to the identity of an input signal.

6. A device according to claim 1, characterised in that the frequency-linear filter consists of 800 lines.

7. A device according to claim 3, characterized in that the frequency-logarithmic filter consists of 32 one-third octave bands.

8. A device according to according to claim 3, characterized in that it comprises a decision means for making a decision with respect to the identity of an input signal.

9. A device according to claim 1, characterised in that the frequency-logarithmic filter consists of 32 one-third octave bands.

10. A device according to according to claim 4, characterized in that it comprises a decision means for making a decision with respect to the identity of an input signal.

11. A device according to claim 1, characterised in that it comprises a decision means for making a decision with respect to the identity of an input signal.

12. A device according to claim 11, characterised in that the weighting means comprises the decision means.

13. A method for analysing and filtering sound, characterised by the following steps:

filtering the sound signal parallel in a frequency-linear filter and a frequency-logarithmic filter; and combining and non-linearly weighting the parallel output signals from the frequency-linear filter and the frequency-logarithmic filter by means of a weighting means.

* * * * *